United States Patent
Tanaka et al.

(10) Patent No.: US 8,610,871 B2
(45) Date of Patent: Dec. 17, 2013

(54) METHOD FOR FORMING MULTILAYER STRUCTURE, METHOD FOR MANUFACTURING DISPLAY PANEL, AND DISPLAY PANEL

(75) Inventors: Yoshitaka Tanaka, Tokyo (JP); Hiroyuki Chikamori, Kochi (JP)

(73) Assignee: Casio Computer Co., Ltd., Tokyo (JP)

( * ) Notice: Subject to any disclaimer, the term of this patent is extended or adjusted under 35 U.S.C. 154(b) by 659 days.

(21) Appl. No.: 12/690,707

(22) Filed: Jan. 20, 2010

(65) Prior Publication Data

US 2010/0188592 A1 Jul. 29, 2010

(30) Foreign Application Priority Data

Jan. 27, 2009 (JP) .................................. 2009-015154
Dec. 17, 2009 (JP) .................................. 2009-286291

(51) Int. Cl.
*G02F 1/13* (2006.01)
*H01L 21/00* (2006.01)

(52) U.S. Cl.
USPC .............................. 349/187; 349/152; 438/30

(58) Field of Classification Search
USPC .......................... 349/152, 187; 438/30, 42, 43
See application file for complete search history.

(56) References Cited

U.S. PATENT DOCUMENTS

| | | | | |
|---|---|---|---|---|
| 5,496,749 A * | 3/1996 | Nasu et al. | ........................ | 438/30 |
| 6,384,878 B1 * | 5/2002 | Kwak | ............................... | 349/40 |
| 6,396,078 B1 * | 5/2002 | Uochi et al. | ...................... | 257/66 |
| 2002/0109799 A1 * | 8/2002 | Choi et al. | ........................ | 349/43 |
| 2005/0270447 A1 * | 12/2005 | Tasaka et al. | .................. | 349/113 |
| 2007/0087486 A1 * | 4/2007 | Tanaka | ........................... | 438/149 |
| 2007/0298538 A1 * | 12/2007 | Tanabe et al. | ................. | 438/107 |
| 2008/0280385 A1 | 11/2008 | Tanaka | | |

FOREIGN PATENT DOCUMENTS

| | | |
|---|---|---|
| JP | 09-213968 A | 8/1997 |
| JP | 2005-242372 A | 9/2005 |
| JP | 2007-103569 A | 4/2007 |
| KR | 10-0318838 B1 | 9/2002 |
| KR | 10-2007-0037692 A | 4/2007 |

OTHER PUBLICATIONS

Korean Office Action in a counterpart application KR 10-2010-0005815, dated Mar. 21, 2011.
Japanese Office Action in counterpart application JP2009-286291, dated on Feb. 22, 2011.

* cited by examiner

*Primary Examiner* — Michael Caley
(74) *Attorney, Agent, or Firm* — Chen Yoshimura LLP

(57) ABSTRACT

A method for forming a multilayer includes a process for forming a first conductive layer on a substrate; a process for forming a first insulating layer on the first conductive layer; a process for forming a second conductive layer on the first insulating layer and patterning the deposited second conductive layer; a process for forming a second insulating layer over the substrate so as to cover the patterned the second conductive layer; a process for forming a third insulating layer on the second insulating layer, wherein an etching speed of the third insulating layer is faster than that of the second insulating layer; and a process for forming contact holes at once that expose at least a part of the first conductive layer to the first insulating layer, the second insulating layer and the third insulating layer.

18 Claims, 19 Drawing Sheets

METHOD FOR FORMING MULTILAYER STRUCTURE, METHOD FOR MANUFACTURING DISPLAY PANEL, AND DISPLAY PANEL

CROSS-REFERENCE TO RELATED APPLICATIONS

This application is based upon and claims the benefit of priority from Japanese Patent Application No. 2009-015154, filed in Japan on Jan. 27, 2009, and Japanese Patent Application No. 2009-286291, filed in Japan on Dec. 17, 2009, both of which are hereby incorporated by reference in their entireties.

BACKGROUND OF THE INVENTION

1. Field of the Invention

The present invention relates to a method for forming a multilayer structure, a method for manufacturing a display panel, and a display panel.

2. Description of the Related Art

In recent years, active matrix type liquid crystal display panels that employ a thin film transistor (TFT) as a switching element have been developed. On the display area of the active matrix type liquid crystal display panel, there are provided a plurality of pixels arranged in a matrix. That is, on one of two substrates arranged to face each other, a plurality of pixel electrodes are arranged in a matrix. Each of the plurality of pixels electrodes is connected to either one of a source electrode and a drain electrode of the respective corresponding thin film transistor. The other one of the source electrode and the drain electrode of the thin film transistor is connected to a signal line that extends in the column direction. In addition, a gate electrode in the thin film transistor is connected to a scanning line that extends in the row direction.

Here, the signal line and the scanning line are formed as different layers with respect to each other via a first insulating layer between the signal line and the scanning line. That is, by forming the signal line and the scanning line as different conductive layers with respect to each other, the signal line and the scanning line will not be shorted in regions of intersections thereof and can be respectively formed to extend in directions perpendicular to each other.

As the thin film transistor, an inversely-staggered type and a coplanar type are known. For example, in the inversely-staggered type thin film transistor, the gate electrode thereof is formed as a first conductive layer that is located on the substrate side opposite to the semiconductor thin film side, and the source/drain electrode is formed as a second conductive layer that is located on a liquid crystal side opposite to the semiconductor thin film side. Therefore, when the inversely-staggered type is used as the thin film transistors, the scanning lines that are connected to the gate electrodes is formed of the same first conductive layer as the gate electrodes, and the signal lines are formed of the same second conductive layer as the source/drain electrodes.

The thin film transistor and the signal line are covered with a planarization film as a second insulating layer, which is deposited on an upper layer side thereof (the liquid crystal layer side). Accordingly, in order to electrically connect the first conductive layer to a third conductive layer that is formed on the second insulating layer, a part of the first conductive layer needs to be exposed by forming a contact hole through the first insulating layer and the second insulating layer. In this case, the contact hole formed in the first insulating layer and the contact hole formed in the second insulating layer are formed at once by the same photolithography process so as to communicate with each other.

However, even when the first insulating layer and the second insulating layer are formed of the same material, as shown in FIG. 20, it is recognized that the cross-section shape of the contact hole 61 in the second insulating layer 63 is formed in a reverse tapered shape while the cross-sectional shape of the contact hole 61 in the first insulating layer 62 is formed in a tapered shape. The cause of this anomaly is considered as follows. When the second conductive layer 64 is formed and/or patterned on the first insulating layer 62, the surface condition of the first insulating layer 62 changes. This change in the surface condition causes the boundary between the first insulating layer 62 and the second insulating layer 63 more susceptible to etching—i.e., the etching rate of the insulating layers 62,63 is faster near the boundary between these two insulating layers during the formation of the contact hole 61. More specifically, it is considered that the altered boundary layer on the first insulating layer 62 is etched from the exposed edge first, and, as a result, the surface of the second insulating layer 63 that is facing the first insulating layer 62 is exposed. Accordingly, the second insulating layer 62 is also etched from the exposed surface.

When the second insulating layer 63 is formed in the reverse tapered shape as described above, a third conductive layer 65, which is formed on the second insulating layer 63 to make contact with the first conductive layer 66 within the contact hole 61, cannot appropriately cover the contour of contact hole 61, leaving discontinued portions in the third conductive layer 65 as shown in FIG. 20. In other words, the coverage of the third conductive layer 65 along the contour of the contact hole 61 is not adequate. This results in connection error between the third conductive layer 66 and the first conductive layer 65.

SUMMARY OF THE INVENTION

Accordingly, the present invention is directed to a method for forming a multilayer structure, a method for manufacturing a display panel, and a display panel that substantially obviate one or more of the problems due to limitations and disadvantages of the related art.

Objects of the present invention are to provide an improved method for forming a multiplayer structure and an improved method for manufacturing a display panel, and to provide an improved display panel.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present invention provides a method for forming a multilayer structure, including forming a first conductive layer on a substrate; forming a first insulating layer on the first conductive layer; forming a patterned second conductive layer on the first insulating layer; forming a second insulating layer over the substrate so as to cover the patterned second conductive layer; forming a third insulating layer on the second insulating layer, wherein an etching speed of the third insulating layer is faster than an etching speed of the second insulating layer for a prescribed etching method; and forming a contact hole that penetrates through the first insulating layer, the second insulating layer and the third insulating layer at once using the prescribed etching method to expose at least a part of the first conductive layer.

In another aspect, the present invention provides a method for forming a multilayer structure, including forming a first conductive layer on a substrate; forming a first silicon nitride layer on the first conductive layer; forming a patterned second conductive layer on the first silicon nitride layer; forming a second silicon nitride layer over the substrate so as to cover the patterned second conductive layer; forming a third silicon nitride layer on the second silicon nitride layer, wherein the third silicon nitride layer contains more nitrogen than the second silicon nitride layer; and forming a contact hole that penetrates through the first silicon nitride layer, the second silicon nitride layer and the third silicon nitride layer at once to expose at least a part of the first conductive layer.

In another aspect, the present invention provides a method for forming a multilayer, including forming a first conductive layer on a substrate; forming a first insulating layer on the first conductive layer; forming a patterned second conductive layer on the first insulating layer; forming a second insulating layer over the substrate so as to cover the patterned second conductive layer by chemical vapor deposition using a first gas and a second gas; forming a third insulating layer on the second insulating layer by chemical vapor deposition using the first gas and the second gas, wherein a flow rate of the second gas relative to the first gas in forming the third insulating layer is larger than the flow rate of the second gas relative to the first gas in forming the second insulating layer; and forming a contact hole that penetrates through the first insulating layer, the second insulating layer and the third insulating layer at once to expose at least a part of the first conductive layer.

In another aspect, the present invention provides a method for manufacturing a display panel, including forming a first conductive layer on a substrate; forming at least a scanning line and a gate electrode by patterning the first conductive layer; forming a first insulating layer over the substrate so as to cover the scanning line and the gate electrode; forming a second conductive layer on the first insulating layer; forming at least a signal line, a drain electrode and a source electrode by patterning the second conductive layer; forming a second insulating layer over the substrate so as to cover the signal line, the drain electrode and the source electrode; forming a third insulating layer on the second insulating layer, wherein an etching speed of the third insulating layer is faster than an etching speed of the second insulating layer for a prescribed etching method; and forming a contact hole that penetrates through the first insulating layer, the second insulating layer and the third insulating layer at once using the prescribed etching method to expose a part of the scanning line.

In another aspect, the present invention provides a display panel, including a first substrate; a scanning line and a gate electrode formed as a first conductive layer on the first substrate; a first insulating layer formed on the first conductive layer, the first insulating layer having a contact hole that exposes at least a part of the first conductive layer; a signal line, a drain electrode and a source electrode formed as a second conductive layer on the first insulating layer; a second insulating layer made of silicon nitride, formed on the second conductive layer, the second insulating layer having a contact hole that communicates with the contact hole in the first insulating layer; and a third insulating layer made of silicon nitride, formed on the second insulating layer, the third insulating layer having a contact hole that communicates with the contact hole of the first insulating layer and with the contact hole of the second insulating layer, wherein the silicon nitride of the third insulating layer contains more nitride than the silicon nitride of the second insulating layer.

In another aspect, the present invention provides a method of forming a multilayer structure, including forming a first layer, a surface of the first layer being exposed to a condition that makes said surface subject to faster etching than other portion of the first layer for a prescribed etching method; forming a second layer on said surface of the first layer; forming a third layer on the second layer; and forming a hole penetrating through the first, second and third layers using said prescribed etching method, wherein the third layer is configured such that in the step of forming the hole, a reverse tapered shape at an edge of the second layer due to said surface of the first layer is substantially prevented.

According to at least some of these aspects of the present invention, when a contact hole is formed in each of the upper and lower insulating layers that sandwiches a conductive pattern, for example, the shape of the resulting contact hole is such that a reliable connection can be established between a conductive layer formed over the upper insulating layer and a conductive layer formed under the lower insulating layer through the contact hole.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1A:
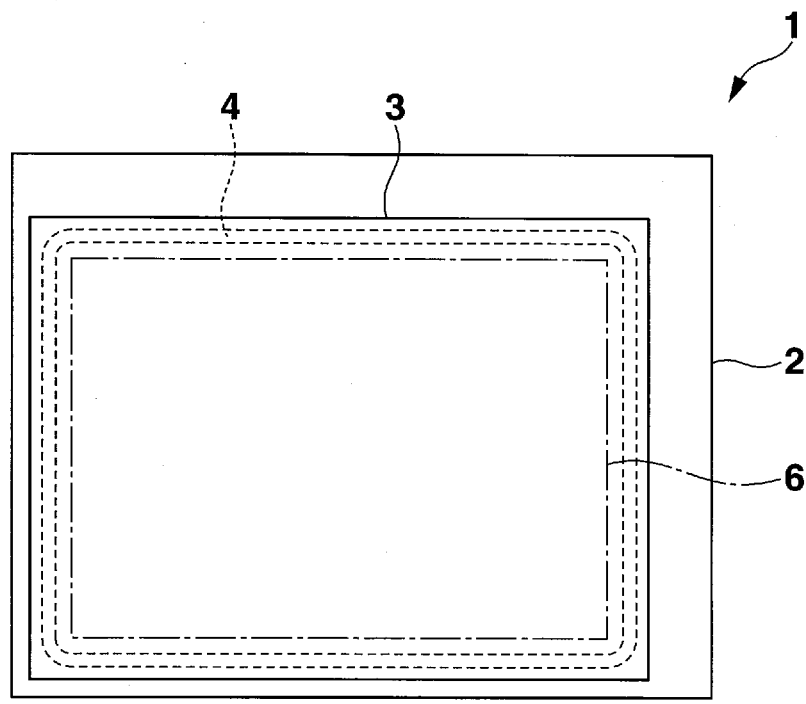
FIG. 1A is a schematic plan view of an LCD panel.
Figure 1B:
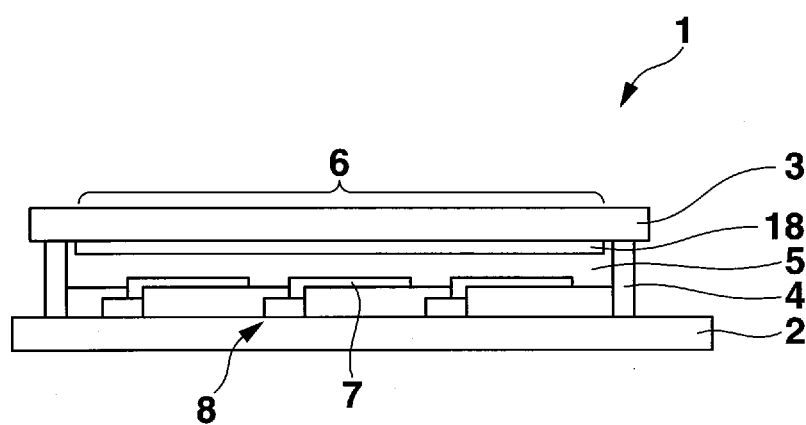
FIG. 1B is a schematic cross-section view of an LCD panel.

Exemplary embodiments for implementing the present invention will now be described with reference to the figures. As shown in FIGS. 1A and 1B, an active matrix type liquid crystal display panel 1 is provided with a first substrate 2 and a second substrate 3 that are arranged to face each other. The first substrate 2 and the second substrate 3 are bonded with a seal material 4 that is formed in a frame shape. Between the first substrate 2 and the second substrate 3, a liquid crystal layer 5 is formed by disposing liquid crystal in a region surrounded by the seal material 4. The liquid crystal display panel 1 is provided with a plurality of pixels that is arranged in a matrix in a display area 6.

Figure 2:
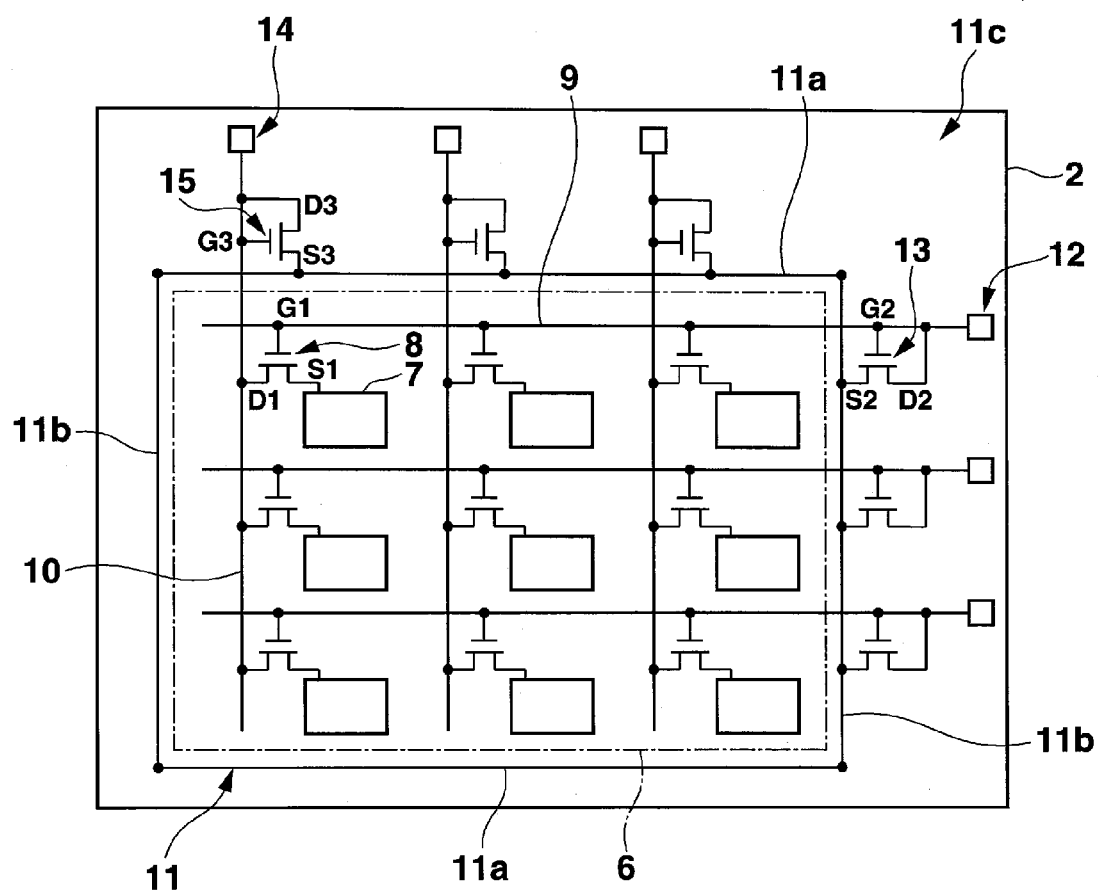
FIG. 2 is a plan view depicting an equivalent circuit diagram of a thin film transistor array.

FIG. 2 is a plan view of an equivalent circuit diagram of a thin film transistor array that is formed on the first substrate 2. The first substrate 2 is provided with a plurality of pixel electrodes 7 that is arranged in a matrix in the display area 6 so as to associate one pixel with one of the pixel electrodes 7. Each of the pixel electrodes 7 is connected to either one of the source/drain electrodes—for example, the source electrode S1—of the respective corresponding thin film transistor 8. The other one of the source/drain electrode of the thin film transistor 8—for example, the drain electrode D1—is connected to a signal line 10 that extends in the column direction. In addition, a gate electrode G1 of the thin film transistor 8 is connected to a scanning line 9 that extends in the row direction. Here, the thin film transistor 8 functions as a switching element. For instance, an nMOS type thin film transistor can be used as the thin film transistor 8. The scanning line 9 is to provide the gate electrode G1 of the thin film transistor 8 with a scanning signal for on/off controlling of the thin film transistor 8. The signal line 10 is to provide the pixel electrode 7 with a data signal via the thin film transistor 8. As described in detail later, the scanning line 9 and the signal line 10 are formed as different conductive layers with respect to each other via an insulating layer located between the scanning line 9 and the signal line 10.

In addition, around the display area 6, an electrostatic protection ring 11 for protecting the thin film transistors 8 and other components from static electricity is formed so as to surround the display area 6. The electrostatic protection ring 11 has first wirings 11a that extend in parallel with the scanning lines 9 and second wirings 11b that extend in parallel with the signal lines 10. The first wirings 11a are formed of the same conductive layer as the scanning line 9, and the second wirings 11b are formed of the same conductive layer as the signal line 10. The first wirings 11a and the second wirings 11b are electrically connected to each other, as described in detail below.

The scanning lines 9 and the signal lines 10 extend from the area surrounded by the electrostatic protection ring 11 to an external area 11c. The scanning line 9 is connected to a first external connecting terminal 12 that is provided in the external area 11c, and also is connected to a first electrostatic protection element 13 located between the electrostatic protection ring 11 and the first external connecting terminal 12. The signal line 10 is connected to a second external connecting terminal 14 that is provided in the external area 11c, and also is connected to a second electrostatic protection element 15 located between the electrostatic protection ring 11 and the second external connecting terminal 14.

The first external connecting terminal 12 and the second external connecting terminal 14 are electrically connected to respective external circuits via appropriate connecting members, such as flexible wiring boards.

The source electrode S2 of the first electrostatic protection element 13 is connected to the second wiring 11b of the electrostatic protection ring 11, and the gate electrode G2 and the drain electrode D2 thereof are connected to the scanning line 9. Thus, the first electrostatic protection element 13 is formed as a two terminal type thin film transistor. When static electricity having a very high voltage comes into the scanning line 9, the first electrostatic protection element 13 changes from its OFF state to the ON state, thereby electrically connecting the scanning line 9 to the electrostatic protection ring 11, and as a result, the static electricity applied to the scanning line 9 is dissipated onto the electrostatic protection ring 11.

The source electrode S3 of the second electrostatic protection element 15 is connected to the first wiring 11a of the electrostatic protection ring 11, and the gate electrode G3 and the drain electrode D3 thereof are connected to the signal line 10. Thus, the second electrostatic protection element 15 is formed as a two terminal type thin film transistor. When static electricity having a very high voltage comes into the signal line 10, the second electrostatic protection element 15 changes from its OFF state to the ON state, thereby electrically connecting the signal line 10 to the electrostatic protection ring 11, and as a result, the static electricity applied to the signal line 10 is dissipated onto the electrostatic protection ring 11.

As shown in FIG. 1B, on a second substrate 3, a common electrode 18 that will receive the same voltage for all the pixels is formed. In addition, liquid crystal is disposed in the area surrounded by the seal material 4 to form a liquid crystal layer 5 between the common electrode 18 and the pixel electrodes 7.

Figure 3:
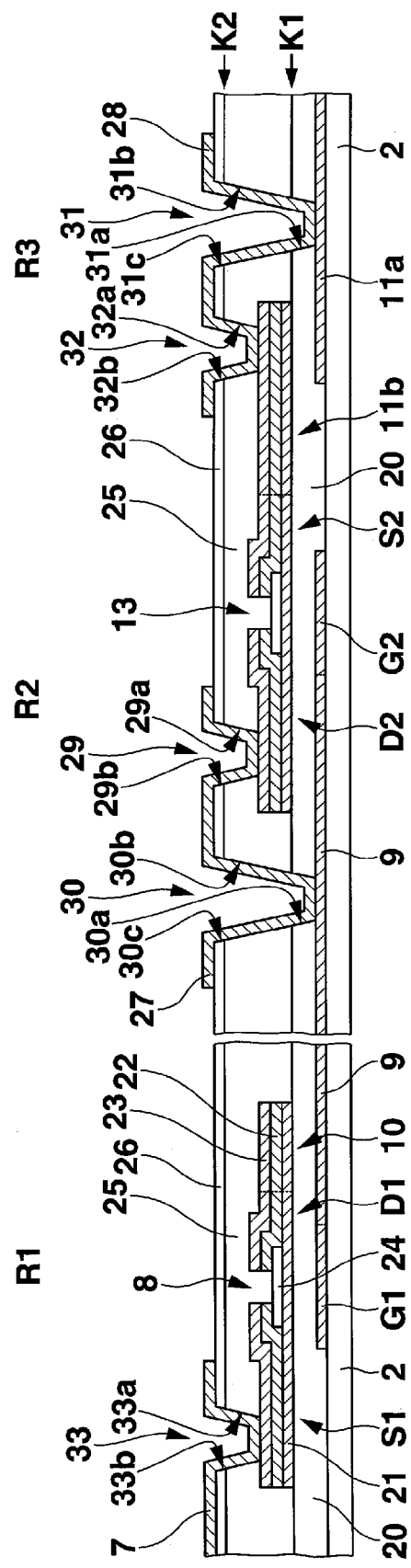
FIG. 3 is a cross-section view of a multilayer structure formed on a first substrate.

The structures of various layers formed on the first substrate 2 according to the present embodiment will now be described. FIG. 3 is a cross-section view showing a region R1 where the thin transistor 8 is formed, a region R2 where the first electrostatic protection element 13 is formed, and a region R3 where the first wiring 11a and the second wiring 11b of the electrostatic protection ring 11 are connected to each other. While the first electrostatic protection element 13 will be mainly explained hereinafter, the cross-section structure or the forming method of the second electrostatic protection element 15 is the substantially same as those for the first electrostatic protection element 13.

On the first substrate that is composed of a transparent material such as a glass material, the gate electrodes G1 and G2, the scanning line 9 and the first wiring 11a of the electrostatic protection ring 11 are formed as a first conductive layer. The first conductive layer is formed of a light-shielding metallic material, such as chromium, aluminum, molybdenum, or titanium, etc. The first conductive layer is covered with a first insulating layer 20 that is composed of an insulating material. The first insulating layer 20 also functions as a gate insulating film, and is formed of an inorganic material, such as silicon nitride (SiN or $Si_3N_4$) or silicon oxide ($SiO_2$), for example.

On the first insulating layer 20, as a second conductive layer, the source electrodes S1, S2, the drain electrodes D1, D2, the signal line 10 and the second wiring 11b of the electrostatic protection ring 11 are formed. The second conductive layer is formed of a multilayer structure in which a semiconductor layer 21, an ohmic contact layer 22 and a metallic layer 23 are formed successively in that order. The semiconductor layer 21 is formed of semiconductor, such as amorphous silicon or polysilicon, for example. The ohmic contact layer 22 is formed of a relatively low resistance semiconductor, such as amorphous silicon or polysilicon doped with impurities. The metallic layer 23 is formed of a light-shielding metallic material, such as chromium, aluminum, molybdenum, or titanium, for example.

In regions corresponding to the respective channels of the thin film transistor 8 and the first electrostatic protection element 13, as a layer between the semiconductor layer 21 and the ohmic contact layer 22, an etching protection layer 24 composed of an insulating material is provided.

The second conductive layer is covered by a second insulating layer 25 that is composed of an insulating material. The second insulating layer 25 also functions as a planarization layer that planarizes an unevenness caused by the thin film transistor 8 and the first electrostatic protection element 13, and is formed of, for example, an inorganic material, such as silicon nitride (SiN or $Si_3N_4$) or silicon oxide ($SiO_2$).

On the second insulating layer 25, a third insulating layer 26 that is composed of an insulating material is formed at a thickness smaller than that of the second insulating layer 25.

For example, when the thickness of the second insulating layer 25 is 1,500 Å, the thickness of the third insulating layer 26 should preferably be less than 1,000 Å, more preferably about 20 Å to about 300 Å.

On the third insulating layer 26, a pixel electrode 7 and connecting lines 27, 28 are formed as a third conductive layer. The third conductive layer is formed of a transparent material, such as ITO (Indium Tin Oxide) or the like.

The connecting line 27 is to electrically connect the scanning line 9 and the gate electrode G2 of the first electrostatic protection element 13 to the drain electrode D2 of the first electrostatic protection element 13, and is disposed in such a way as to contact the drain electrode D2 in a first contact area 29 and to contact the scanning line 9 in a second contact area 30. That is, in the first contact area 29, a first contact hole 29a, 29b is formed in the second and third insulating layers 25, 26, respectively, to expose a portion of the drain electrode D2 of the first electrostatic protection element 13. On the other hand, in the second contact area 30, a second contact hole 30a, 30b, 30c is formed in the first, second, and third insulating layers 20, 25, and 26, respectively, to expose a portion of the scanning line 9. In addition, the connecting line 27 is disposed in such a way as to cover the first contact hole 29a, 29b and the second contact hole 30a, 30b, 30c.

The connecting line 28 is to electrically connect the first wiring 11a of the electrostatic protection ring 11 to the second wiring 11b, and is disposed in such a way as to contact the first wiring 11a in a third contact area 31 and to contact the second wiring 11b in a fourth contact area 32. That is, in the third contact area 31, a third contact hole 31a, 31b, 31c is formed in the first, second and third insulating layers 20, 25, and 25, respectively, to expose a portion of the first wiring 11a. In the fourth contact area 32, a fourth contact hole 32a, 32b is formed in the second and third insulating layers 25 and 26, respectively, to expose a portion of the second wiring 11b.

In the second insulating layer 25 and the third insulating layer 26, a fifth contact hole 33a, 33b is formed in a region 33 corresponding to the source electrode S1 of the thin film transistor 8. By disposing the pixel electrode 7 so as to cover the fifth contact hole 33a, 33b, the pixel electrode 7 contacts the source electrode S1 of the thin film transistor 8 and is thereby electrically connected to the source electrode S1.

Figure 4:
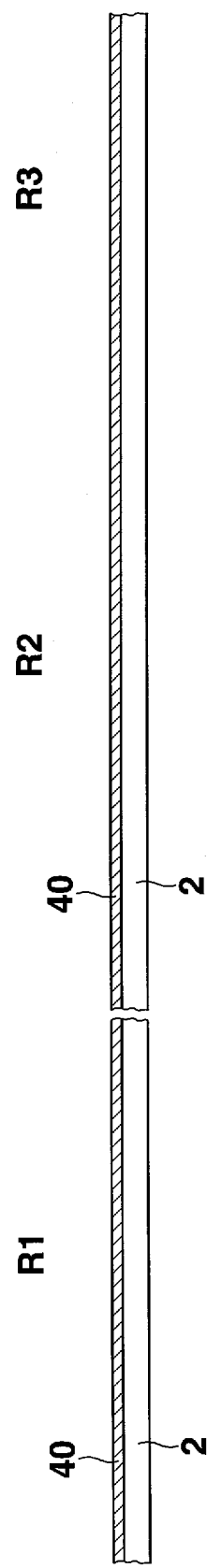
FIG. 4 is an explanatory diagram of a formation method for a multilayer structure on the first substrate and shows a state of having deposited a first conductive layer on the first substrate.

An exemplary method for manufacturing the multilayer structure on the first substrate 2 as described above according to an embodiment of the present invention will now be described with reference to FIGS. 3-12. First, the first substrate 2 that is composed of an transparent material such as glass or the like is prepared. Then, as shown in FIG. 4, on the whole surface of the first substrate 2, a light shielding metal, such as chromium, aluminum, molybdenum, titanium or the like, is formed as a first conductive layer 40 by sputtering or CVD (Chemical Vapor Deposition). Here, the first conductive layer may be made of a transparent conductive material, such as ITO or the like, instead of the light-shielding material.

Figure 5:
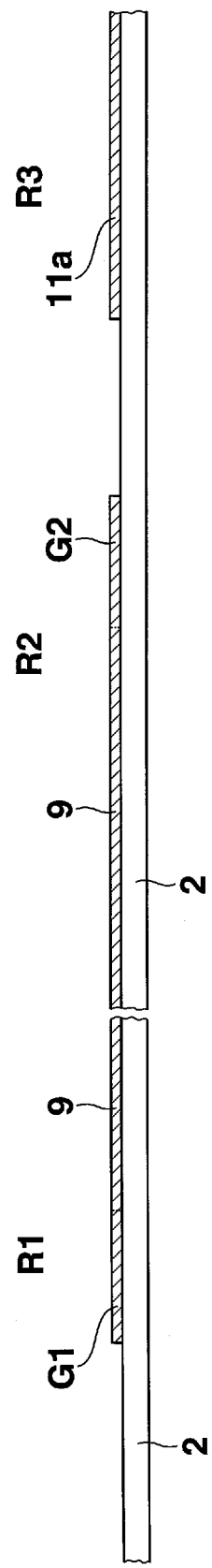
FIG. 5 is an explanatory diagram of the formation method for the multilayer structure on the first substrate and shows a state of having patterned the first conductive layer.

Next, a photoresist is applied on the first conductive layer 40, and the applied photoresist is patterned by exposure and development. The exposed parts of the first conductive layer 40 are etched using the patterned photoresist as a mask. Thereafter, by removing the photoresist, the gate electrodes G1, G2, the scanning line 9 and the first wiring 11a of the electrostatic protection ring 11 are formed as the patterned first conductive layer 40, as shown in FIG. 5.

Figure 6:
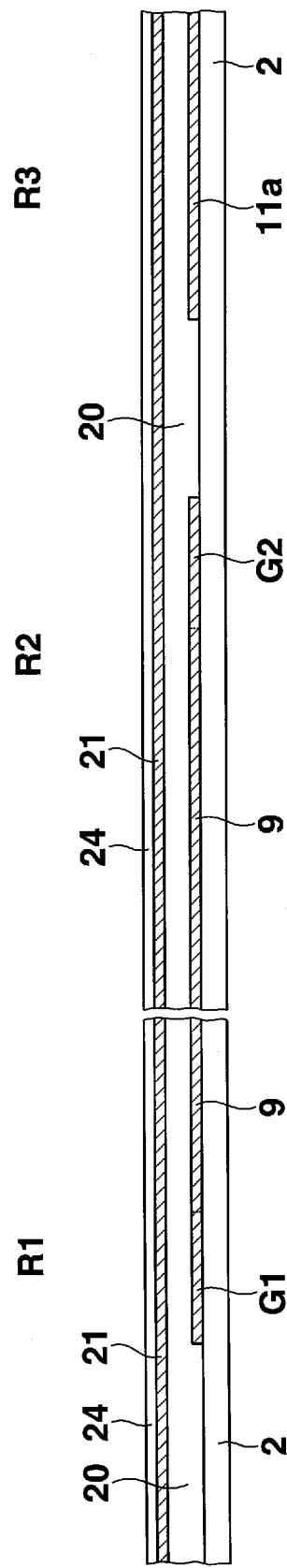
FIG. 6 is an explanatory diagram of the formation method for the multilayer structure on the first substrate and shows a state of having deposited a first insulating layer, a semiconductor layer and an etching prevention layer.

Next, referring to FIG. 6, an inorganic insulating film, such as silicon nitride (SiN or $Si_3N_4$), silicon oxide ($SiO_2$), or the like, is formed on the first substrate 2 as a first insulating layer 20 by plasma CVD, for example, so as to cover the patterned first conductive layer 40. Here, if the first insulating layer 20 is formed of silicon nitride, as the processing gases, silane ($SiH_4$) can be used as the primary source gas, ammonia ($NH_3$) as the secondary source gas, and nitrogen ($N_2$) as a diluent gas, respectively.

Next, as shown in FIG. 6, a semiconductor layer 21 that is composed of amorphous silicon or polysilicon is formed on the first insulating layer 20 by plasma CVD or like method. Then, an inorganic insulating film, such as silicon nitride (SiN or $Si_3N_4$) or the like, is formed on the semiconductor layer 21 by plasma CVD or like method as an etching protection layer 24. Here, it is preferable to continuously form the first insulating layer 20, the semiconductor layer 21 and the etching protection layer 24.

Figure 7:
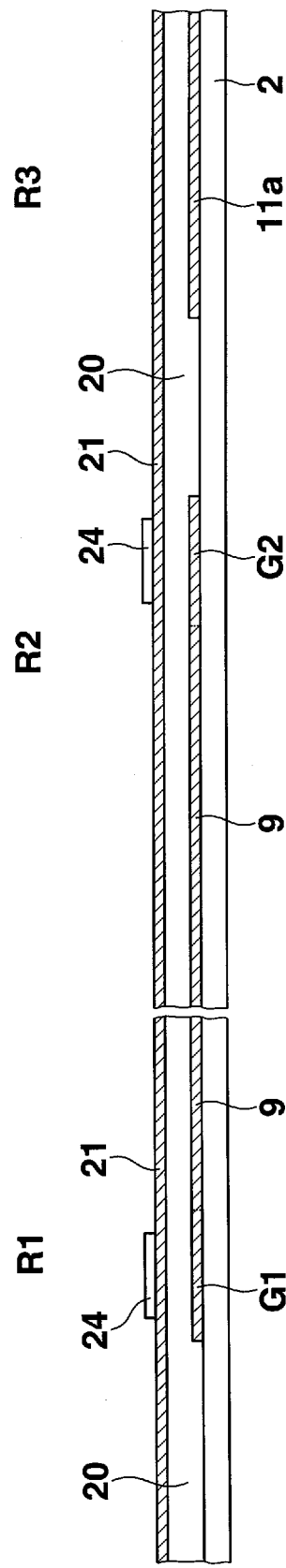
FIG. 7 is an explanatory diagram of the formation method for the multilayer structure on the first substrate and shows a state of having patterned the etching prevention layer.

Next, a photoresist is applied on the etching protection layer 24, and the applied photoresist is patterned by exposure and development. The exposed parts of the etching protection layer 24 are etched using the patterned photoresist as a mask. Thereafter, by removing the photoresist, the patterned etching protection layer 24, which remains in regions corresponding to the channels of transistors, is formed (FIG. 7).

Figure 8:
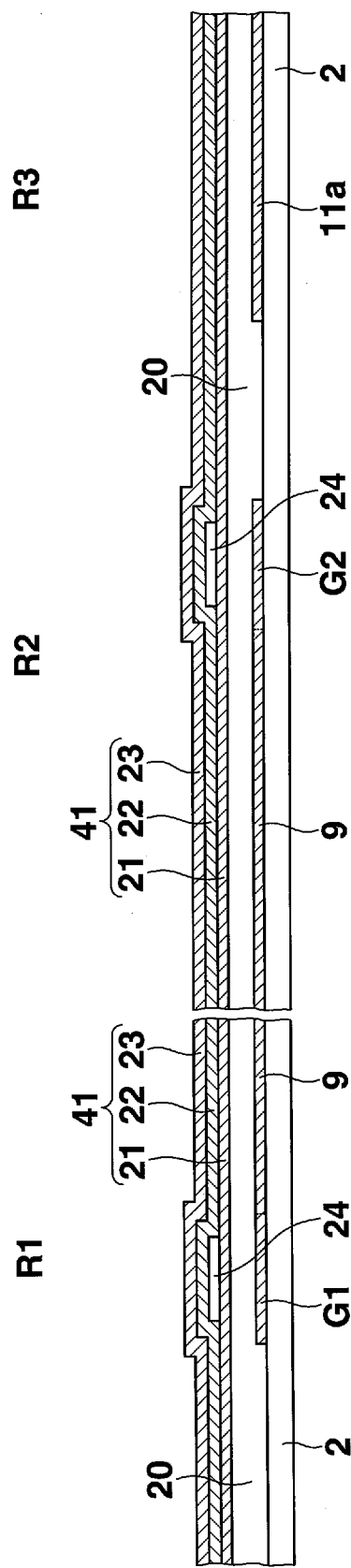
FIG. 8 is an explanatory diagram of the formation method for the multilayer structure on the first substrate and shows a state of having deposited an ohmic contact layer and a second conductive layer.

Next, referring to FIG. 8, a relatively low resistance semiconductor, such as amorphous silicon or polysilicon doped with impurities, is formed over the first substrate 2 as the ohmic contact layer 22 so as to cover the patterned etching protection layer 24. Then, a metallic layer 23 that is made of a light-shielding metallic material, such as chromium, aluminum, molybdenum, titanium or the like, is formed on the ohmic contact layer 22 by sputtering or CVD. Here, the metallic layer 23 may be made of a transparent conductive material, such as ITO or the like, instead of the light-shielding material.

As described above, the semiconductor layer 21, the ohmic contact layer 22 and the metallic layer 23 collectively constitute a second conductive layer 41.

Figure 9:
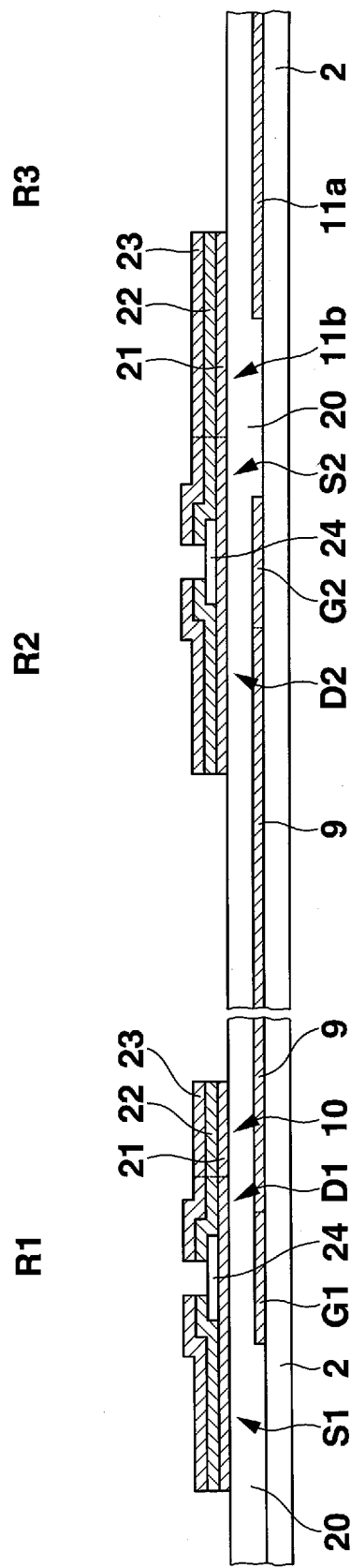
FIG. 9 is an explanatory diagram of the formation method for the multilayer structure on the first substrate and shows a state of having patterned the second conductive layer.

Next, a photoresist is applied on the metallic layer 23, and the applied photoresist is patterned by exposure and development. The exposed portions of the semiconductor layer 21, the ohmic contact layer 22 and the metallic layer 23 are etched at once using the patterned photoresist as the mask. Thereafter, by removing the photoresist, the source electrodes S1, S2, the drain electrodes D1, D2, the signal line 10 and the second wiring 11b of the electrostatic protection ring 11 are formed as a patterned second conductive layer 41 (FIG. 9). In this case, the semiconductor layer 21 in the area covered by the etching protection layer 24 remains intact because it is protected by the etching protection layer 24.

Next, an inorganic insulating film, such as silicon nitride (SiN or $Si_3N_3$), silicon oxide ($SiO_2$) or the like, is formed as the second insulating layer 25 over the first substrate 2 by plasma CVD or like method so as to cover the patterned second conductive layer 41, and then an inorganic insulating film, such as silicon nitride (SiN or $Si_3N_3$), silicon oxide ($SiO_2$) or the like, is formed as the third insulating layer 26 on the second insulating layer 25 by plasma CVD or like method.

The following explanation is for an exemplary case in which the constituent elements of the first insulating layer 20 are the same as the constituent elements of the second and third insulating layers 25 and 26. For example, if the first insulating layer 20 is formed of silicon nitride, the second insulating layer 25 and the third insulating layer 26 may also be formed of silicon nitride. Then, with regard to the processing gases for the second and third insulating layers 25 and 25, as in the case of the first insulating layer 20, silane ($SiH_4$) is used as the primary source gas, ammonia ($NH_3$) as the secondary source gas, and nitrogen ($N_2$) as the diluent gas. In this case, the flow rates of these gases for forming the second insulating layer 25 are set up to be the same as those for the formation of the first insulating layer 20. However, at least some of the flow rates of these gases for the formation of the third insulating layer 26 are set differently from those for the formation of the second insulating layer 25. The film formation conditions for the second insulating layer 25 and the third insulating layer 26 will be described in detail below.

Figure 10:
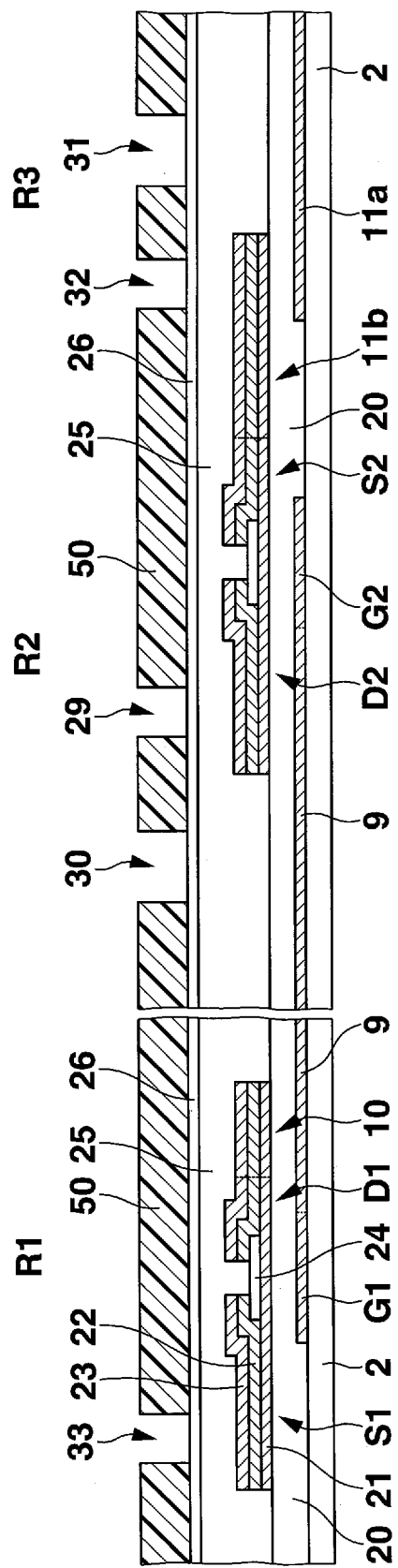
FIG. 10 is an explanatory diagram of the formation method for the multilayer structure on the first substrate and shows a state of having patterned a photoresist on a third insulating layer.

Next, a photoresist is applied on the third insulating layer 26, and the applied photoresist is patterned by exposure and development. Here, as shown in FIG. 10, the patterned photoresist 50 is formed so as to expose portions of the third insulating layer 26 that correspond to the first contact area 29, the second contact area 30, the third contact area 31, the fourth contact area 32 and the fifth contact area 33, respectively.

Figure 11:
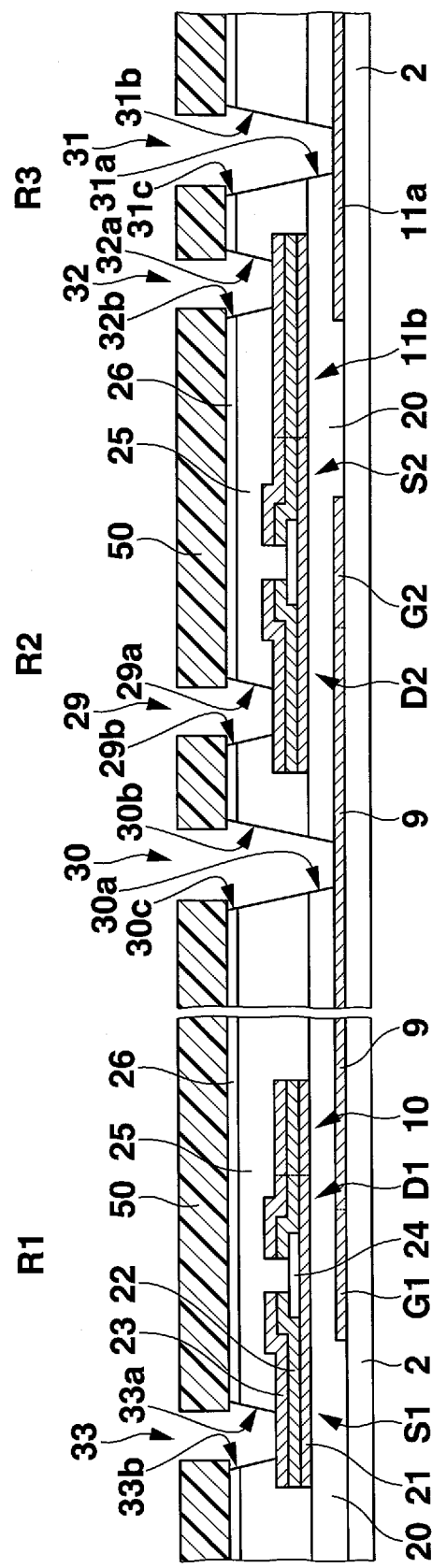
FIG. 11 is an explanatory diagram of the formation method for the multilayer structure on the first substrate and shows a state of having formed contact holes in the first insulating layer, the second insulating layer and in the third insulating layer.

Next, the exposed portions of the first insulating layer 20, the second insulating layer 25 and the third insulating layer 26 (which have been exposed by the patterned photoresist 50) are etched at once by dry etching using the patterned photoresist 50 as a mask. Consequently, as shown in FIG. 11, the above-described contact holes are formed in the first insulating layer 20, the second insulating layer 25 and the third insulating layer 26 in the respective contact areas 29, 30, 31, 32, and 33. As the etching gas, for example, a mixed gas of $CF_4$, $SF_6$, $O_2$, $H_2$, and the like, for example, can be employed. Note that because the metallic layer 23 is not etched during such dry etching, the first insulating layer 20 covered by the second conductive layer is not etched. This can be seen in the first contact region 29 of FIG. 11, for example.

Figure 12:
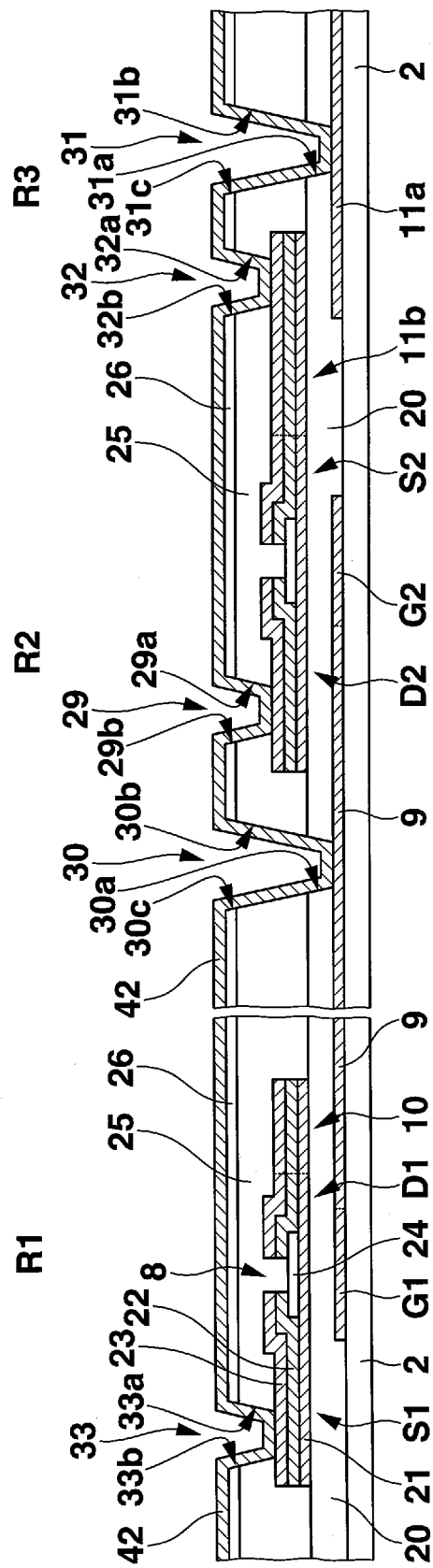
FIG. 12 is an explanatory diagram of the formation method for the multilayer structure on the first substrate and shows a state of having formed a third conductive layer.
Figure 13:
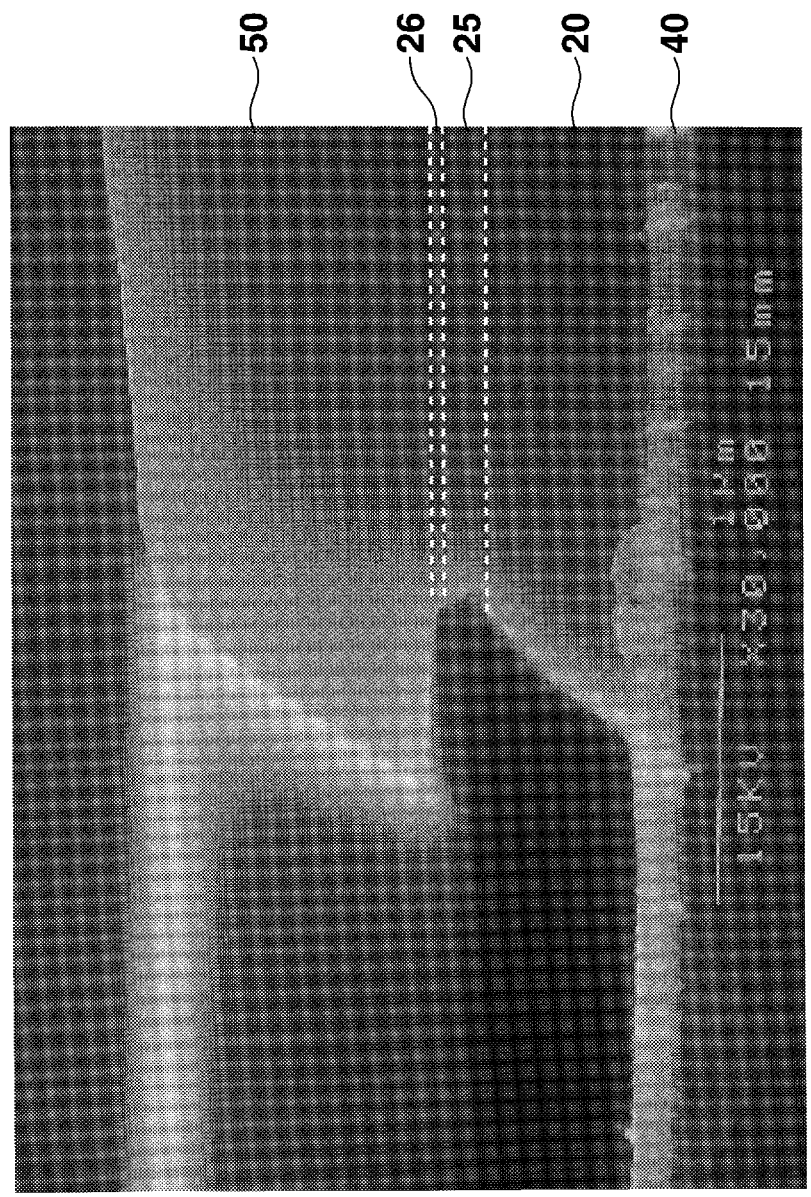
FIG. 13 is a cross-section photograph of a contact hole by SEM (scanning electron microscope) when the flow rate of a secondary source gas was set at 0.17 L/min for both second insulation layer formation and third insulating layer formation.
Figure 14:
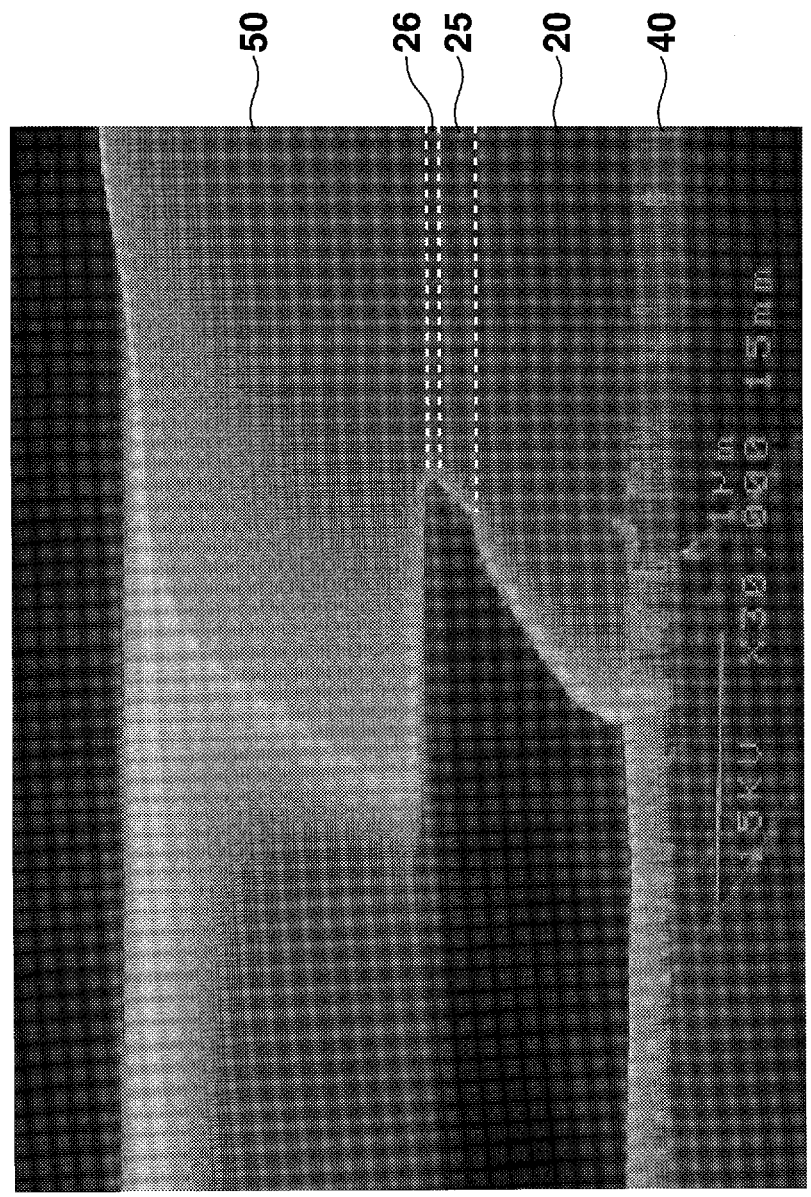
FIG. 14 is a cross-section photograph of a contact hole by SEM when the flow rate of the secondary source gas was set to 0.17 L/min in depositing the second insulating layer and the flow rate was set to 0.19 L/min in depositing the third insulating layer.
Figure 15:
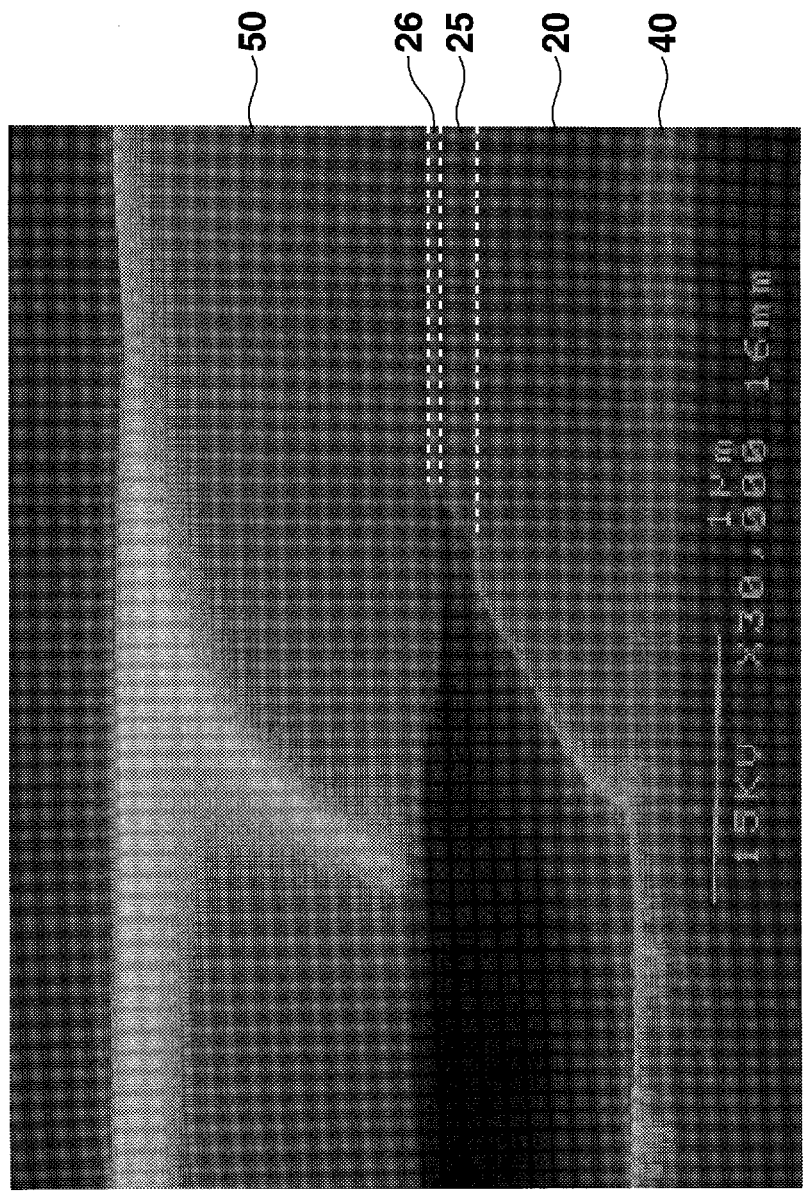
FIG. 15 is a cross-section photograph of a contact hole by SEM when the flow rate of the secondary source gas was set to 0.17 L/min in depositing the second insulating layer and the flow rate was set to 0.22 L/min in depositing the third insulating layer.
Figure 16:
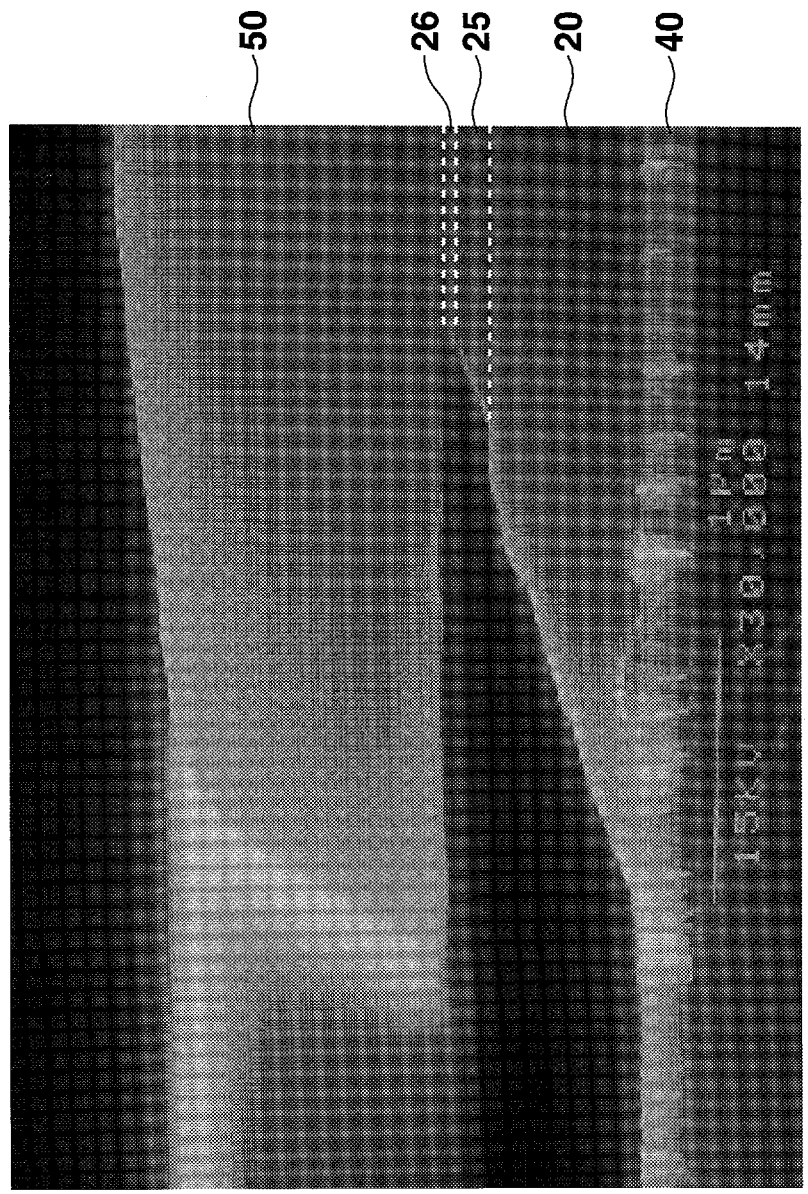
FIG. 16 is a cross-section photograph of a contact hole by SEM, when the flow rate of the secondary source gas was set to 0.17 L/min in depositing the second insulating layer and the flow rate was set to 0.34 L/min in depositing the third insulating layer.

Next, the photoresist 50 is removed, and a transparent conductive material, such as ITO or the like, is formed over the first substrate 2 by sputtering or like method as a third conductive layer 42 so as to cover the third insulating layer 26 having the contact holes therein (FIG. 12).

Next, a photoresist is applied on the third conductive layer 42, and the applied photoresist is patterned by exposure and development. Then, portions of the third conductive layer 42 that have been exposed by the patterned photoresist are etched using the patterned photoresist as the mask. Then, by removing the photoresist, the pixels electrode 7, the first connecting line 27 and the second wiring line 28 are formed as the patterned third conductive layer 42 as shown in FIG. 3.

By forming the multilayer structure as described above, the pixel electrode 7 in the third conductive layer 42 is electrically connected to the source electrode S1 in the second conductive layer 41 at the same time as when the first conductive layer 40 is electrically connected to the second conductive layer 41. In other words, the first conductive layer 40 can be electrically connected to the second conductive layer 41 without the need to form a contact hole in the first insulating layer 20 prior to the formation of the second conductive layer 41 on the first insulating layer 20. Accordingly, the number of the manufacturing steps can be reduced.

The formation conditions for the second insulating layer 25 and the third insulating layer 26 will now be described. As described above, the surface of the first insulating layer 20 changes in its physical and/or chemical characteristics due to various processes it undergoes until the second insulating layer 25 is formed over the first insulating layer 20. Therefore, when the contact holes are formed, the etching speed of the first and second insulating layers 20 and 25 in the lateral direction is very high at or near a boundary K1 between the first insulating layer 20 and the second insulating layer 25. The closer the etching region is with respect to the boundary K1, the faster the etching rate is. Accordingly, without any countermeasure, the cross-section shape of the contact hole in the second insulating layer 25 is subject to a reverse tapered shape. In this exemplary embodiment, the etching rate in the lateral direction of the third insulating layer 26 is set to be substantially the same as or greater than the etching rate at the boundary surface K1. With this configuration, the etching rate of the second insulating layer 25 becomes greater near the boundary K2 between the second insulating layer 25 and the third insulating layer 26. In particular, the closer the etching region of the second insulating layer 25 with respect to the boundary K2, the faster the etching rate. This way, the reverse tapered shape can be alleviated or substantially eliminated.

When the insulating layer is made of silicon nitride, the etching rate can be increased by incorporating an increased amount of nitrogen in the silicon nitride layer. The nitrogen content in silicon nitride can be increased, for example, by increasing the flow rate of ammonia which is used as the secondary source gas during the deposition.

FIGS. 13-16 are cross-section photographs taken by SEM (scanning electron microscope) when the first insulating layer 20, the second insulating layer 25 and the third insulating layer 26 are formed of silicon nitride, and a contact hole is formed through the first insulating layer 20, the second insulating layer 25 and through the third insulating layer 26.

Here, the deposition condition of the first insulating layer 20 is the same among the respective figures; the flow rate of the silane ($SiH_4$) was 0.17 L/min, the flow rate of the ammonia ($NH_3$) was 0.17 L/min, and the flow rate of the nitrogen ($N_2$) was 2.5 L/min.

The deposition condition of the second insulating layer 25 is the same among the respective figures; the flow rate of silane ($SiH_4$) was 0.17 L/min, the flow rate of ammonia ($NH_3$) was 0.17 L/min, and the flow rate of the nitrogen ($N_2$) was 2.5 L/min. The thickness of the second insulating layer 25 made under this condition was 1,700 Å.

For the deposition condition of the third insulating layer 26, the flow rate of ammonia differs among the respective figures. That is, the flow rate of ammonia ($NH_3$) of FIG. 13 was the same as that for the depositions of the first insulating layer 20 and the second insulating layer 25, and was 0.17 L/min. The flow rate of ammonia ($NH_3$) of FIG. 14 was 0.19 L/min, that of FIG. 15 was 0.22 L/min, and that of FIG. 16 was 0.34 L/min. Other conditions, such as the flow rate of the silane ($SiH_4$) and the flow rate of the nitrogen ($N_2$), are the same among the figures; i.e., the flow rate of silane ($SiH_4$) was 0.17 L/min, and the flow rate of nitrogen ($N_2$) was 2.5 L/min. The thickness of the third insulating layer 26 formed under the above conditions is the same among the respective figures and was 300 Å.

Figure 17:
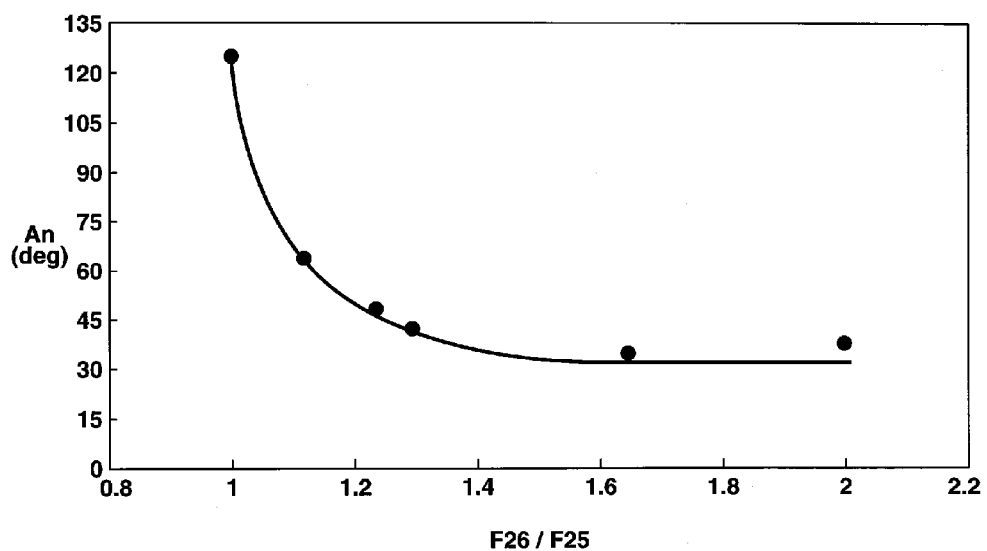
FIG. 17 is an explanatory chart showing a relation between a flow rate ratio of the secondary source gas and the tapered angle of the second insulating layer.

In FIG. 17, the horizontal axis shows a ratio F26/F25 in which F26 is the flow rate of ammonia ($NH_3$) for the deposition of the third insulating layer 26, and F25 is the flow rate of ammonia ($NH_3$) for the deposition of the second insulating layer 25. The vertical axis shows the tapered angle An (deg.) of the edge of the second insulating layer 25 measured in accordance with the above described photographs by SEM. By increasing the flow rate F26 of ammonia ($NH_3$) for the deposition of the third insulating layer 26 beyond the flow rate F25 of ammonia ($NH_3$) for the deposition of the second insulating layer 25, the reverse tapered shape of the cross-section of the second insulating layer 25 is reduced or eliminated. Furthermore, it turns out that a forward tapered shape can be controllably obtained.

This is because the edge face of the third insulating layer 26 is etched faster than the edge face of the second insulating layer 25. As a result, the surface of the second insulating layer 25 that is facing and in contact with the third insulating layer 26 is successively and quickly exposed, and the second insulating layer 25 is etched at the exposed surface.

That is, by controlling the flow rate of the secondary source gas during the formation of the third insulating layer 26 so that it is suitably greater than the flow rate of the of the secondary source gas for the formation of the second insulating layer 25, the coverage of the third conductive layer 42 that is formed over the second insulating layer 25 and the third insulating layer 26 can be significantly improved.

Figure 18:
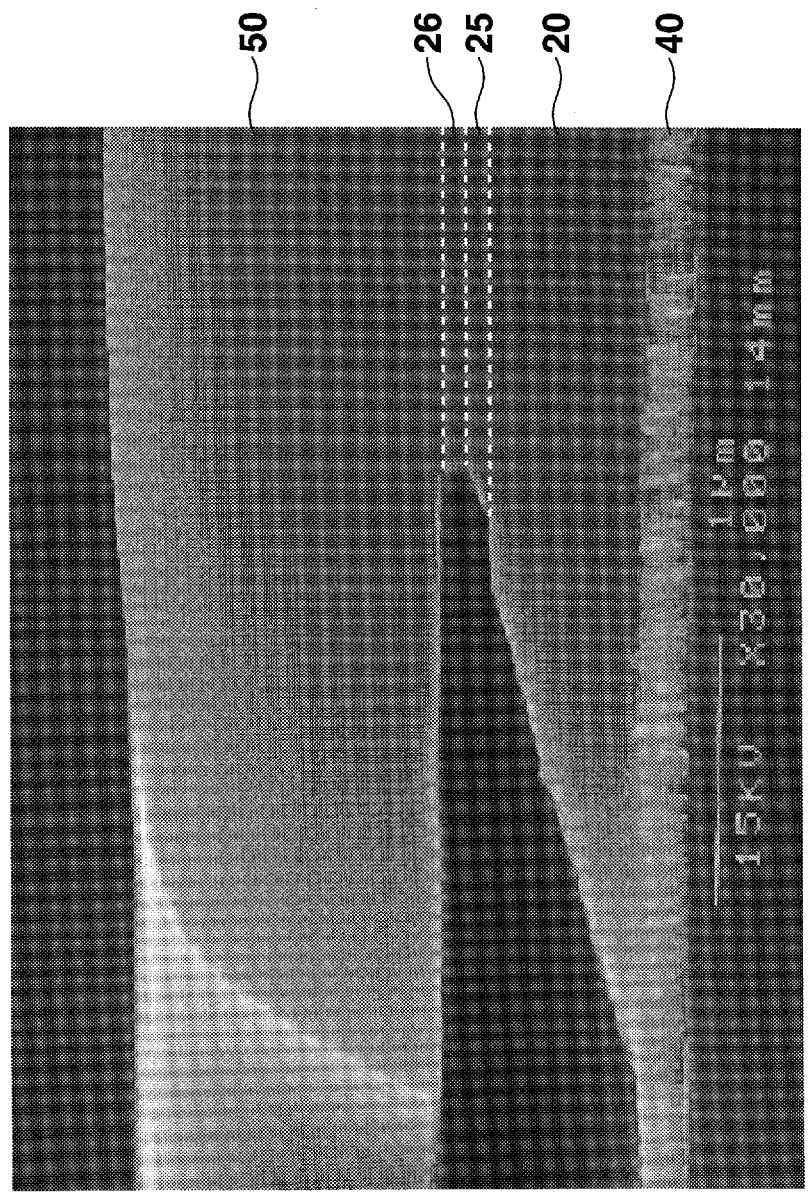
FIG. 18 is a cross-section photograph of a contact hole by SEM where the thickness of the second insulating layer and the thickness of the third insulating layer are both 1,000 Å, respectively.

FIG. 18 shows a case in which the flow rate of ammonia ($NH_3$) for the deposition of the third insulating layer 26 was set to 0.34 L/min, and the thickness of the second insulating layer 25 was decreased to 1,000 Å and the thickness of the third insulating layer 26 was increased to 1,000 Å. It can be seen that even in such a case, the reverse tapered shape of the cross-section of the second insulating layer 25 is alleviated. Furthermore, it was found that a forward tapered shape can be controllably obtained. However, because the electric insulation property and the dielectric breakdown properties may deteriorate when a more amount of nitrogen is contained in the silicon nitride layer. Thus, it is preferable that the second insulating layer 25 be formed to a relatively thick thickness of, for example, about 1,500 Å or more, and the third insulating layer 26 be formed to a relatively thin thickness of, for example, about 20 Å to about 300 Å.

In the above-described exemplary embodiments, the second insulating layer 25 and the third insulating layer 26 were formed of the same material. However, as long as the etch rate of the material of the third insulating layer 26 in the lateral direction is greater than that of the second insulating layer 25, the third insulating layer 26 can be made of a material different from that for the second insulating layer 25. However, when the second insulating layer 25 and the third insulating layer 26 are formed of the same material, they can be sequentially deposited using the same chamber, which is advantageous.

In the above-described exemplary embodiments, the first insulating layer 20, the second insulating layer 25 and the third insulating layer 26 were dry-etched. However, the present invention is not limited to such dry-etching. Because the same or similar phenomenon occurs for the etching rate in the lateral direction in wet-etching, wet-etching using an etching liquid can also be applied to the etching process of the first insulating layer 20, the second insulating layer 25 and the third insulating layer 26.

The above-described exemplary embodiments describe cases for forming a multilayer structure in the liquid crystal display panel. However, the present invention is not limited to such application, and the method and structures described with reference to the above examples can be applied to multilayer structures in an organic EL display panel or other display or non-display related devices having an applicable multiplayer structure.

The above-described exemplary embodiments explain cases of forming thin film transistors. The present invention is not limited to this. In particular, the present invention can be applied to devices having a multilayer wiring structure with no thin film transistor.

Figure 19:
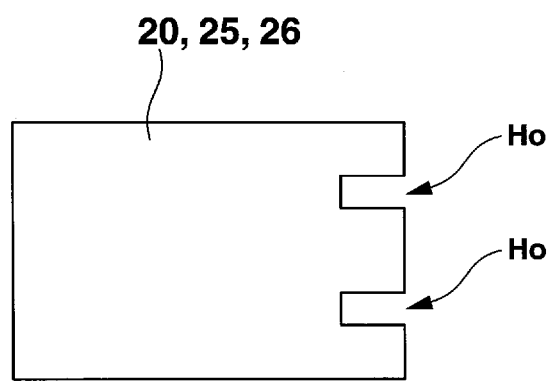
FIG. 19 shows an example of a planar pattern of a contact hole.
Figure 20:
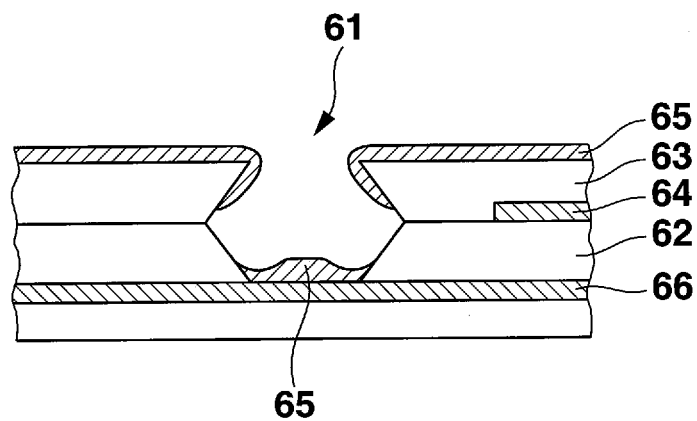
FIG. 20 is an explanatory diagram illustrating a case of deteriorated coverage of a contact hole by a metal layer.

In the above-described exemplary embodiments, the contact holes were formed in the first insulating layer 20, the second insulating layer 25 and the third insulating layer 26. Thus, the contact holes Ho can be formed in shape such that they are completely surrounded by the first insulating layer 20, the second insulating layer 25 and the third insulating layer 26. However, the present invention is not limited to such a structure. For example, as shown in FIG. 19, contact holes Ho may take a shape in which none of the first insulating layer 20, the second insulating layer 25 and the third insulating layer 26 is present in a prescribed direction.

Moreover, some or all of the first, second and third insulating layers may be formed of an organic material.

It will be apparent to those skilled in the art that various modification and variations can be made in the present invention without departing from the spirit or scope of the invention. Thus, it is intended that the present invention cover modifications and variations that come within the scope of the appended claims and their equivalents.

What is claimed is:

1. A method for forming a multilayer structure, comprising:
    forming a first conductive layer on a substrate;
    forming a first insulating layer on the first conductive layer;
    forming a patterned second conductive layer on the first insulating layer;
    forming a second insulating layer over the substrate so as to cover the patterned second conductive layer;
    forming a third insulating layer on the second insulating layer, wherein an etching speed of the third insulating layer is faster than an etching speed of the second insulating layer for a prescribed etching method; and
    forming a contact hole that penetrates through the first insulating layer, the second insulating layer and the third insulating layer at once using the prescribed etching method to expose at least a part of the first conductive layer, wherein a portion of the first insulating layer exposed by the contact hole has a first surface that is inclined with respect to a surface of the substrate and a second surface that is substantially parallel to the surface of the substrate, and the second surface of the first insulating layer has a substantially flat top surface profile adjacent to a boundary with the second insulating layer,
    wherein constituent elements of processing gases used for forming the first insulating layer are the same as constituent elements of processing gases used for forming the second insulating layer, and flow rates of the constituent elements of the processing gases in forming the first insulating layer are the same as corresponding flow rates of the constituent elements of the processing gases in forming the second insulating layer.

2. The method according to claim 1, wherein the first insulating layer, the second insulating layer and the third insulating layer are formed of an inorganic material.

3. The method according to claim 2, wherein the first insulating layer, the second insulating layer and the third insulating layer are formed of silicon nitride.

4. The method according to claim 2, wherein the third insulating layer is formed so as to contain more nitrogen than the second insulating layer.

5. The method according to claim 4, wherein the prescribed etching method uses an etching gas including $CF_4$ or $SF_6$.

6. The method according to claim 1, further comprising:
    forming a third conductive layer on an area where the contact hole is formed after forming the contact hole.

7. The method according to claim 1, wherein a thickness of the second insulating layer is about 1,500 Å or more, and a thickness of the third insulating layer is about 20 Å to about 300 Å.

8. The method according to claim 1,
    wherein the first insulating layer is a first silicon nitride layer,
    wherein the second insulating layer is a second silicon nitride layer, and
    wherein the third insulating layer is a third silicon nitride layer containing more nitrogen than the second silicon nitride layer.

9. The method according to claim 1,
    wherein the second insulating layer is formed by chemical vapor deposition using a first gas and a second gas, and
    wherein the third insulating layer is formed by chemical vapor deposition using the first gas and the second gas, a flow rate of the second gas relative to the first gas in forming the third insulating layer being larger than the flow rate of the second gas relative to the first gas in forming the second insulating layer.

10. The method according to claim 9, wherein the first gas is silane, and the second gas is ammonia.

11. The method according to claim 10, wherein the steps of forming the second and third insulating layers includes use of a nitrogen gas as a diluent.

12. The method according to claim 10, wherein the third insulating layer is formed so as to contain more nitrogen than the second insulating layer.

13. The method according to claim 9, wherein the flow rate of the first gas in forming the second insulating layer is substantially equal to the flow rate of the first gas in forming the third insulating layer.

14. The method according to claim 9, wherein the first insulating layer is formed by chemical vapor deposition using the first gas and the second gas.

15. The method according to claim 9, further comprising:
    forming a third conductive layer on an area where the contact hole is formed after forming the contact hole.

16. The method according to claim 9, wherein a thickness of the second insulating layer is about 1,500 Å or more, and a thickness of the third insulating layer is about 20 Å to about 300 Å.

17. The method according to claim 1, wherein the constituent elements of processing gases used for forming the second insulating layer are the same as constituent elements of processing gases used for forming the third insulating layer, and flow rates of the constituent elements of processing gases in forming the third insulating layer are different from the corresponding flow rates of the constituent elements of processing gases in forming the first and second insulating layers.

18. The method according to claim 17, wherein constituent elements of the first insulating layer are the same as constituent elements of the second and third insulating layers.

* * * * *